United States Patent [19]

Ashkinazi et al.

[11] Patent Number: 5,622,877

[45] Date of Patent: Apr. 22, 1997

[54] METHOD FOR MAKING HIGH-VOLTAGE HIGH-SPEED GALLIUM ARSENIDE POWER SCHOTTKY DIODE

[75] Inventors: German Ashkinazi, Tel Aviv; Boris Meyler, Ramat Gan; Menachem Nathan, Tel Aviv; Leonid Zolotarevski, Tel Aviv; Olga Zolotarevski, Tel Aviv, all of Israel

[73] Assignee: Ramot University Authority for Applied Research & Industrial Development Ltd., Tel Aviv, Israel

[21] Appl. No.: 326,893

[22] Filed: Oct. 21, 1994

Related U.S. Application Data

[63] Continuation of Ser. No. 24,965, Mar. 2, 1993, abandoned.

[51] Int. Cl.⁶ .................................................. H01L 21/265
[52] U.S. Cl. ...................... 438/571; 257/473; 438/572; 438/573; 438/167
[58] Field of Search ............................. 437/39, 175, 176, 437/133, 184, 246; 148/DIG. 140, DIG. 105, DIG. 139; 257/473, 471, 472

[56] References Cited

U.S. PATENT DOCUMENTS

| | | |
|---|---|---|
| 3,198,659 | 8/1965 | Levy . |
| 3,703,408 | 11/1972 | Belasco et al. . |
| 3,706,128 | 12/1972 | Heer ................................. 437/175 |
| 3,820,235 | 6/1974 | Goldman ........................... 437/175 |
| 3,886,580 | 5/1975 | Calviello . |
| 3,891,479 | 6/1975 | Zwernemann ..................... 437/175 |
| 3,915,716 | 10/1975 | Haack . |
| 5,027,166 | 6/1991 | Ohtsuka et al. . |
| 5,112,774 | 5/1992 | Ohtsuka et al. ................... 437/175 |
| 5,135,878 | 8/1992 | Bartur ................................. 437/39 |

FOREIGN PATENT DOCUMENTS

| | | | |
|---|---|---|---|
| 0042380 | 4/1981 | Japan .......................... | 437/39 |
| 0074642 | 3/1983 | Japan . | |
| 0106072 | 4/1984 | Japan . | |

OTHER PUBLICATIONS

G. Ashkinazi et al, "Nickel–Gallium . . . Schottky Diodes", Solid–State Electronics, vol. 36, No. 1, pp. 13–18, 1993.
Muller, Device Electronics for IC's, 1986, p. 31.
Sze, Semiconductor Devices Physics and Tech., John Wiley & Sons, p. 38, 1985.
Jambotkar, "High–Voltage Power . . . Diodes", IBM Tech. Dis. Bull., vol. 25, No. 5, pp. 2331–2333, Oct. 1982.

*Primary Examiner*—John Niebling
*Assistant Examiner*—Long Pham
*Attorney, Agent, or Firm*—Mark M. Friedman

[57] ABSTRACT

A power GaAs Schottky diode with a chemically deposited Ni barrier having a reverse breakdown voltage of 140 V, a forward voltage drop at 50 A/cm² of 0.7 V at 23° C., 0.5 V at 150° C. and 0.3 V at 250° C. and having a reverse leakage current density at −50 V of 0.1 µA/cm² at 23° C. and 1 mA/cm² at 150° C. The high-voltage high-speed power Schottky semiconductor device is made by chemically depositing a nickel barrier electrode on a semiconductor which includes gallium arsenide and then etching the device to create side portions which are treated and protected to create the Schottky device.

19 Claims, 2 Drawing Sheets

METHOD FOR MAKING HIGH-VOLTAGE HIGH-SPEED GALLIUM ARSENIDE POWER SCHOTTKY DIODE

This is a continuation of U.S. patent application Ser. No. 08/024,965, filed Mar. 2, 1993 now abandoned.

FIELD AND BACKGROUND OF THE INVENTION

The present invention relates to Schottky semiconductor devices and, more particularly, to power GaAs Schottky diodes and related semiconductor devices and methods of making such devices. The proposed Schottky semiconductor devices are particularly suited for application as high-voltage high-speed rectifiers.

Power Schottky diodes enjoy a number of advantages over P-N or P-i-N diodes. For example, the forward voltage drop, $V_F$, of a Schottky barrier is significantly lower than that of a P-N junction and can be made as small as 0.5–0.6 V at high current densities. Furthermore, the current transport across a Schottky barrier is mediated by majority carriers, eliminating minority carrier injection and recombination, thereby making possible much higher switching rates.

A major limitation of conventional Schottky diodes is their large leakage currents relative to those of P-N junctions. This leakage puts an upper limit of about 100 V on the reverse blocking voltage of silicon-based Schottky diodes having an acceptable $V_F$.

The properties of silicon Schottky diodes are limited by certain inherent material constraints, namely, low carrier mobility and a relatively narrow band gap. In designing a high-voltage diode, a thick low-doped base must be used, which leads to high series resistance, a bigger $V_F$ and higher heat dissipation. At higher temperatures the reverse leakage current, $I_R$, increases dramatically, rendering the rectification ineffective.

The power Schottky diode, primarily silicon-based, has found extensive usage in high frequency rectifier circuits and power supplies because of its high switching rate and low power loss. However, the use of Schottky diodes made on silicon is limited in many applications by a relatively low voltage, usually less than 70 V, and high leakage current, especially at elevated temperatures.

In an effort to get around the limitations offered by silicon, several alternative materials have been studied, including diamond and SiC. Attention has lately been largely focused on gallium arsenide. It has been shown (see, B. J. Baliga, "Modem power devices" John Wiley & Sons, (1987); G. Ashkinazi, Tz. Hadas, B. Meyler, M. Nathan, L. Zolotarevski and O.Zolotarevski, Nickel-gallium arsenide high-voltage Schottky diodes, Solid State Electron., vol. 36, pp.13–18 (1993), which are incorporated by reference as if fully set forth herein) that several of the disadvantages associated with silicon Schottky diodes my be overcome by use of a gallium arsenide (GaAs) $N^+N^0$ structure.

GaAs displays a higher electron mobility, a wider band gap and a higher peak electrical field strength at breakdown than silicon. These bulk properties make possible the design of a Schottky diode having a thinner base region, which can operate with greater forward current density at higher temperatures, has a small forward voltage drop, $V_F$, and lower leakage current density, $j_R$.

Relatively few power GaAs Schottky diode studies have been reported to date. The practical implementation of power GaAs Schottky diodes is inhibited by the difficulties encountered in producing a near-ideal barrier over a large area. A near-ideal barrier would have an ideality factor of nearly 1.02 and would have a very low density of interface states, or none at all.

High-voltage power Schottky diodes on a GaAs substrate having reverse voltages of up to 200–400 V have been reported (see, B. J. Baliga above, and B. J. Baliga, A. R. Sears, M. M. Barnickle, P. M. Campbell, W. Garwacki and J. P. Walden, IEEE Trans. Electron Devices, ED-32, 1130, (1985); K. Ohtsuka, Y. Kusuzawa, K. Ogata, H. Ichinosawa, U.S. Pat. No. 5,027,166, (1991), which are incorporated by reference as if fully set forth herein) but the fabrication of these diodes requires the use of ultra-high vacuum techniques and/or other expensive methods of preparation, such as molecular beam epitaxy. These techniques are employed since it is imperative to obtain a metal-semiconductor rectifying barrier without any residual oxide and with minimal surface states density at the metal-semiconductor interface.

A simple and inexpensive technology for the fabrication of near-ideal Schottky barriers over large areas has been reported (G. Ashkinazi, Yu. Zilyaev, V. Chelnokov and M. Shul'ga, Sov. Techn. Phys. Lett. (USA), 9, 177 (1983); G. Ashkinazi, L. Zolotarevski, L. Mazo, V. Timofeev, M. Shul'ga and V. Shumilin, Proc. 3rd European Conf. on Power Electron. and Appl., Aachen, FRG, 617 (1989), which are incorporated by reference as if fully set forth herein). The technology involves the chemical deposition of nickel on epitaxial GaAs $N^+N^0$ structures. The first laboratory devices were reported in 1983 and improvements, which resulted in Schottky diodes with an operating $V_{BR}$ of up to 70 V and forward currents of up to 20 to 40A, were reported in 1989.

Another important problem involves minimizing the current of the reverse biased diode, or leakage current, under high reverse voltage. The leakage current is made up of three main components: (a) the reverse current through an ideal barrier; (b) the leakage current through barrier defects, and (c) the leakage current determined by an enhanced electric field on the surface, and other phenomena connected with the surface condition.

The reverse current through an ideal barrier cannot be altered for a given set of barrier parameters. The leakage current through barrier defects can be reduced by using a high quality barrier and a high quality epitaxial layer. To overcome the leakage current determined by an enhanced electric field on the surface, various means are used, including metal field plates, guard rings, and combinations of these (see, B. J. Baliga (1987) above, and S. M. Sze "Physics of semiconductor devices", (1986), which is incorporated by reference as if fully set forth herein), or semi-insulating protection electrodes (see K. Ohtsuka et al. above). A second set of possibilities includes the use of films and/or dielectric compounds and resins.

The first group of methods referenced above requires the use of expensive deposition, photolithography and lift-off apparatus, and also decreases the switching ability of a Schottky diode, while the latter group of techniques requires specially developed side profiling, treatment and protection technology.

There is thus a widely recognized need for, and it would be highly advantageous to have, high-voltage high-speed gallium arsenide power Schottky semiconductor devices, such as diodes, and methods of fabricating them, which devices would be simple and inexpensive to fabricate and which would have performance characteristics significantly superior to those exhibited by corresponding silicon devices.

SUMMARY OF THE INVENTION

According to the present invention there is provided a Schottky semiconductor device, comprising: (a) a first semiconductor region including gallium arsenide having a first semiconductor region donor concentration lower than about $5 \times 10^{15}$ cm$^{-3}$ and a thickness of more than about 3 μm; (b) a barrier electrode in the form of an ordered quasi-epitaxial nickel layer having a thickness of from about 0.05 to about 0.5 μm, the layer being chemically deposited from a basic solution containing nickel, the layer being formed on the first semiconductor region to create a Schottky barrier with an ideality factor of from about 1.00 to about 1.10 between the barrier electrode and the first semiconductor region; (c) a conductive metal layer overlying the barrier electrode; (d) a second semiconductor region joined to the first semiconductor region, the second semiconductor region having a second semiconductor region donor concentration which is greater than about $1 \times 10^{18}$ cm$^3$; and (e) an ohmic contact formed on the second semiconductor region.

The present invention overcomes shortcomings of presently known configurations by providing a high-voltage, high-speed rectifying Schottky semiconductor device with low power loss, which is easy to produce and which does not require expensive apparatus and techniques for its manufacturing.

According to the present invention, the rectifying Schottky contact with the semiconductor body is provided by electroless, auto-catalyzing chemical nickel deposition, and the surface leakage current is lowered by the use of special surface profiling by chemical etching, stabilization by heat treatment in hydrogen, and protection with organic dielectric compounds.

According to the present invention there is thus provided a high-voltage, high-speed, low power loss semiconductor device with nearly ideal Schottky barrier characteristics, which device is made without use of any special and high-cost apparatus.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a GaAs Schottky power diode, and methods for its fabrication. The principles and operation of a Schottky diode, and methods for its fabrication, according to the present invention may be better understood with reference to the drawings and the accompanying description.

Figure 1:
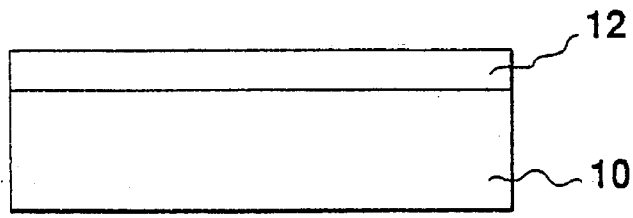
FIG. 1 is a cross-section of the starting semiconductor N$^+$N$^0$ GaAs structure.

(Referring now to the drawing, FIG. 1 illustrates a semiconductor structure which serves as the substrate, or body, of a Schottky diode according to the present invention. The fabrication of a power high-voltage Schottky diode according to the present invention starts with a semiconductor structure, which is typically a GaAs N$^+$N$^0$ epitaxial structure.

A GaAs plate, or semiconductor N$^+$ substrate 10, 300–400 μm thick, which is highly doped, usually with a doping concentration of above about $10^{18}$ cm$^{-3}$, is preferably used as a substrate. An N$^0$ type epitaxial layer 12, preferably about 5 to about 25 μm thick, is created by doping to a concentration of from about 1 to about $2 \times 10^{15}$ cm$^{-3}$, depending on the desired reverse voltage. Such an epitaxial structure can be produced by various suitable known methods, including, but not limited to, gas phase or liquid phase epitaxy.

Figure 2:
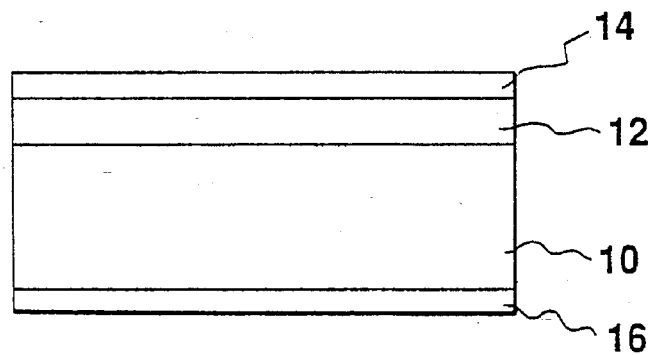
FIG. 2 is a cross-section of the structure of FIG. 1 following nickel deposition.

As illustrated in FIG. 2, onto the outside surfaces of the semiconductor body of FIG. 1 is deposited a nickel layer, designated as 14 and 16 on the side of the semiconductor having the epitaxial layer 12 and on the opposite side, respectively. Nickel layer 14 and 16 is preferably from about 0.05 to about 0.4 μm thick, and is preferably deposited by electroless auto-catalyzing chemical methods from a basic solution, containing Ni salt, and hydrazine as reducing agent. Nickel layer 14 preferably has an ordered quasi-epitaxial structure. "Nickel layer 14 and 16", above, is preferably the result of one nickel layer deposition operation, due to the simultaneous deposition of nickel on both sides of the semiconductor while it is immersed in the solution. Thus, the ohmic contact includes nickel which is chemically deposited, at the same time, on the side of the semiconductor having the epitaxial layer 12, and on the opposite side of the semiconductor.

A suitable Ni deposition is essential for the production of a barrier having near-ideal Schottky properties. Preferably, the Ni deposition includes the following steps:

(a) The semiconductor body is carefully cleaned using any suitable method, including, but not limited to, successive washings in a suitable boiling organic solvent, such as carbon tetrachloride, acetone, isopropyl alcohol, and methanol.

(b) The semiconductor body is subjected to brief chemical etching using any suitable etchant to remove any residual irregularities and impurities from the surface of the epitaxial layer. One example of a suitable etchant is a solution made up of one part $H_2O$, one part $H_2O_2$ and three parts $H_2SO_4$, with the short etching carried out at 60° C. for a period lasting about 30 seconds.

(c) The semiconductor body is washed in deionized water.

(d) The semiconductor body is exposed for about one minute to a concentrated aqueous NH$_4$OH solution to enrich the surface with OH$^-$ and NH$_4^+$ radicals.

(e) The semiconductor body is then immersed into a deposition solution containing nickel salt and hydrazine, preferably at a pH greater than about 8. For example, a deposition solution proposed by G. Ashkinazi, L. Zolotarevski, B. Meyler, A. Reincholm and V. Timofejev, USSR Patent No. 923313, (1981), which is incorporated by reference as if fully set forth herein, may be used at a temperatures of from about 75° C. to about 95° C. Such a solution includes approximately 50 g/l of $(NH_4)Ni(SO_4)_2 \cdot 6H_2O$, approximately 7 g/l of Hydrazine sulphate $(N_2H_6SO_4)$, and a sufficient amount of NH$_4$OH to obtain a pH of ≈9.5. The time of deposition depends on the desired thickness of the Ni layer. For example, using the above solution, a deposition time of about 5 to about 8 minutes yields a Ni layer which is about 0.2 μm thick.

As a result of the deposition procedure described above, a highly ordered quasi-epitaxial layer 14 which is made up of metallic nickel and certain compounds appearing in the Ni-Ga-As phase diagram is formed on top of N$^0$ epitaxial layer 12. The special properties of the deposited contact layer guarantee an intimate metal to semiconductor contact and near-ideal Schottky barrier parameters over extended areas.

That portion of the Ni layer 16 formed on the back side of the semiconductor body serves as an ohmic contact to the highly doped N$^+$ substrate, or GaAs plate 10.

Figure 3:
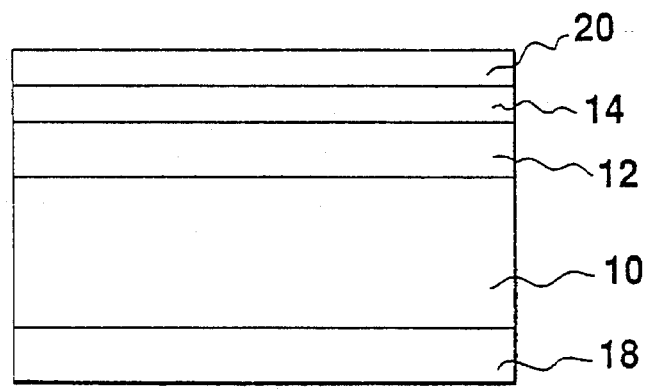
FIG. 3 is a cross-section of the structure of FIG. 2 with the addition of an ohmic contact to the back side and of an aluminum layer on the barrier nickel layer.

Illustrated in FIG. 3 is the device of FIG. 2 following the deposition of an ohmic contact, such as a Au(Ge)Ni contact layer 18 on the back side of the structure, and of an aluminum layer 20, preferably of a thickness greater than about one μm, preferably a few μm's thick, on top of the Ni Schottky barrier metallization, or nickel layer 14.

Au(Ge)Ni contact layer 18 and aluminum layer 20 give a better spreading resistance of the contacts, which brings about a more homogeneous distribution of current across the device area, and furthermore facilitates more reliable packaging of the device. The depositions can be performed by any suitable technique including, but not limited to, vacuum evaporation, reactive sputtering, and the like.

For better Al to Ni adhesion, and to obtain a low contact resistivity to N$^+$ substrate, the structure shown in FIG. 3 is preferably rapid thermal pulse-annealed in forming gas, preferably made up of 10% H$_2$ and 90% N$_2$, at temperatures below about 450° C., preferably from about 200° to about 450° C., for a few seconds. The annealing can alternatively or additionally be performed as a last stage of the diode fabrication.

Figure 4:
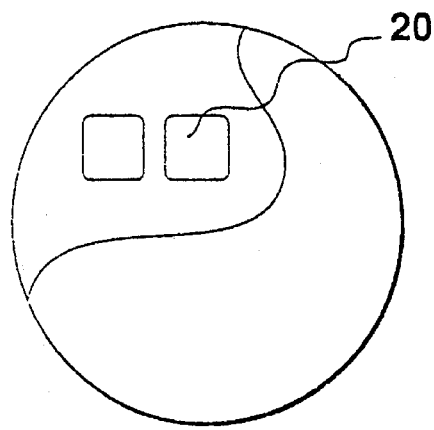
FIG. 4 is a section of a plan view of the device of FIG. 3 following photolythographic patterning, showing individual diodes etched on the aluminum surface.

The results of the next step in the fabrication of a Schottky diode according to the present invention are shown in FIG. 4. Using any suitable technique, preferably using conventional photolithography and lift-off methods, a pattern of discrete elements, preferably a matrix of squares, with sides of a fixed length and separated from each other by a gap of a certain width is formed on aluminum layer 20.

The square characteristic dimension depends on the projected forward current, and is about 3 mm for a 20 A diode. Patterns with circular or other shapes are also possible. The size of the gap between adjacent elements, which is preferably in the range of about 400 to 600 μm to about 2 to 3 mm, is a function of the method of separation of the individual diodes, for example, scribing, laser cut, diamond wheel cut, and the like, the epitaxial layer thickness and dopant concentration and the projected reverse voltage.

Figure 5:
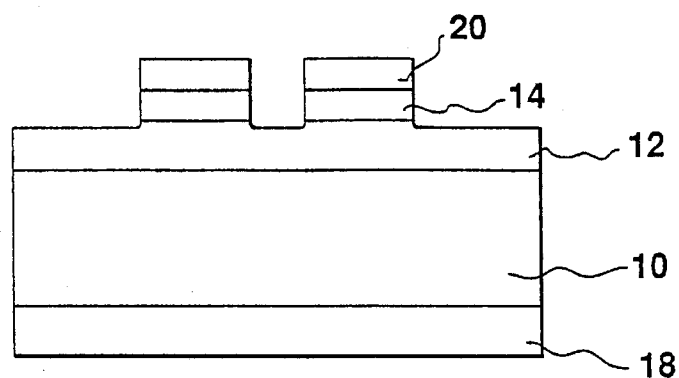
FIG. 5 is a cross-section of the device of FIG. 4 with the matrix of etched individual diodes.

Depicted in FIG. 5 is the matrix of diodes of FIG. 4 after side profiling. The side profiling is preferably effected by etching using any suitable polishing etchant, preferably an etchant based on sulfuric acid. For example, a suitable polishing etchant is a solution made up of three parts H$_2$SO$_4$, one part H$_2$O$_2$ and one part H$_2$O.

The etching is performed up to an etching depth, H (FIG. 8), of about 0.05 to about 3 μm. The distance from the edge of the metal area to the edge of the structure, 1 (FIG. 8), which equals $x_L$+B in FIG. 7), is preferably in the range of about 2 to about 3 times the epitaxial layer thickness to as much as about 0.5 to about 1 mm, the upper limit depending on the resolution of the separation technology used.

Figure 6:
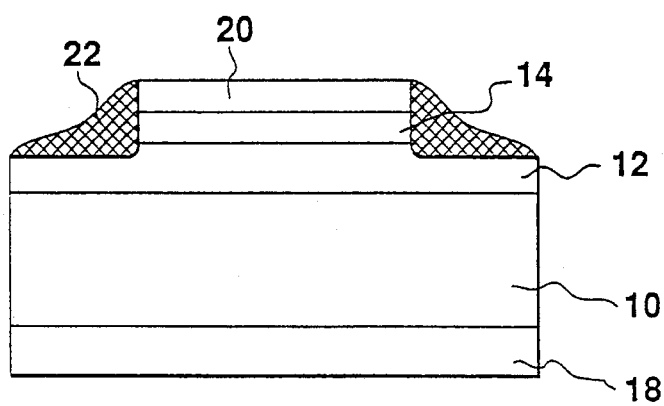
FIG. 6 is a cross-section of an individual diode separated from the structure of FIG. 5 and ready for packaging.

The next step in the fabrication process is the stabilization of the side surface, shown in FIG. 6. This is provided, after removing the photoresist and appropriate cleaning in organic solvents, by an annealing of the matrix of diodes shown in FIG. 5 in hydrogen at temperatures of between about 250° and about 400° C. for not less than about 10 minutes. The annealing is immediately followed by the covering of the bare semiconductor areas by an appropriate dielectric layer 22, for example, a polyimide layer. The technology used for the protection of the semiconductor surface with the dielectric compound depends on the compound type and composition.

The described process of side shaping, stabilization and protection yields a Schottky diode structure with a stable reverse leakage current which is close to the theoretical values at temperatures of up to about 250° C. The resultant Schottky diode further has an applied reverse bias which is close to the calculated breakdown voltage.

The last step in the fabrication of Schottky diodes according to the present invention involves the separation of the matrix into individual diodes. The separation can be accomplished using any suitable means, such as by scribing, by cutting with a diamond saw, or laser beam scribe. FIG. 6 illustrates a cross-section of an individual device in its ready-to-package state.

Figure 7:
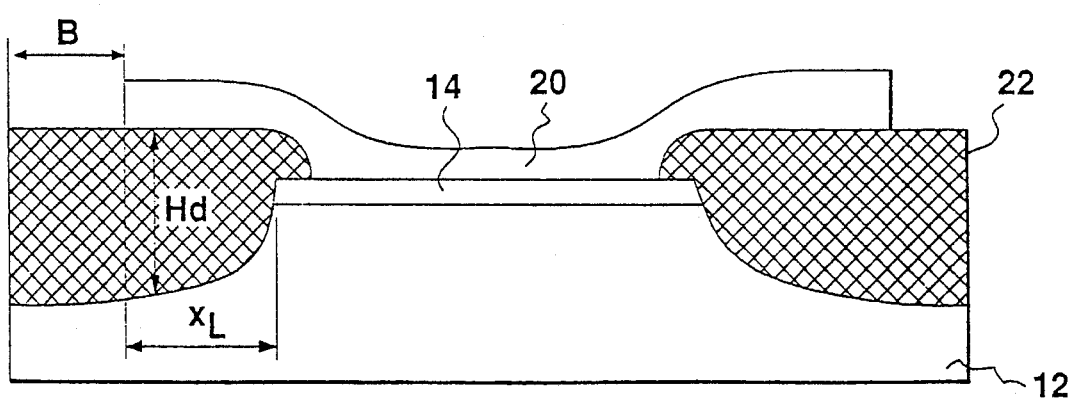
FIG. 7 is a cross-section of a second embodiment of a Schottky high-voltage diode according to the present invention.
Figure 8:
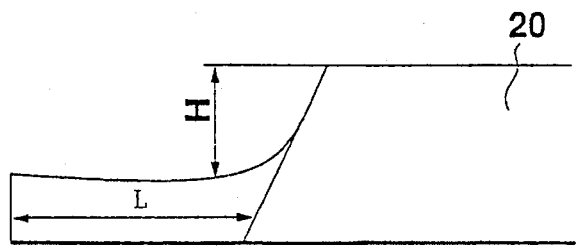
FIG. 8 is a schematic cross-sectional side view of the diode, defining the distances 'H' and 'l'.

An alternative embodiment of a Schottky diode according to the present invention is illustrated in FIG. 7. Such a diode has a reverse breakdown voltage above 200 V. In this embodiment the barrier and the epilayer are etched to a depth, H (FIG. 8), of from about 0.05 to about 3 μm, and the distance, ($x_L$+B), which equals 1 in FIG. 8, from the edge of the barrier electrode to the edge of the device (semiconductor body) is from about 2 to 3 times the epilayer thickness and up to about 0.5 to 1 mm.

The side surface is stabilized by annealing in a hydrogen-containing gas at temperatures between about 250° and about 450° C. for not less than about 10 minutes, and is protected by any appropriate dielectric compound 22, for example, by polyimide. A thick metal film 20, for example, an aluminum layer with a thickness of above 1 μm, is deposited on the top of the structure. The thickness of the dielectric compound must be greater than $H_d$, which equals $V_{br}/E_d$, where $E_d$ is the dielectric strength of dielectric layer 22, and $V_{br}$ is the maximum applied reverse voltage of the diode.

The top metal layer 20 is configured by a photolithography process so that the distance from the barrier electrode edge to the top metal edge, $x_L$, is greater than the epitaxial layer thickness, and the distance from the end of top metal layer to the edge of semiconductor body, B, is greater than three times the depth of the dielectric compound, $H_d$. Such a side protection configuration decreases the electric field strength on the side surface, and also decreases the surface leakage current. The details of the manufacturing by this method of side protection are similar to those described above.

While the invention has been described with respect to a limited number of embodiments, it will be appreciated that many variations, modifications and other applications of the invention may be made.

What is claimed is:

1. A process for making a power Schottky semiconductor device comprising the steps of:

(a) providing a first semiconductor :region including gallium arsenide having a first semiconductor region donor concentration lower than about 5×10$^{15}$ cm$^{-3}$ and a thickness of more than about 3 micro-meters, said first semiconductor region joined to a second semiconductor region having a second semiconductor region donor concentration which is greater than about $1 \times 10^{18}$ cm$^{-3}$;

(b) chemically depositing a barrier electrode in the form of an ordered epitaxial nickel layer having a thickness of from about 0.05 to about 0.5 micrometers, said nickel layer being chemically deposited from a solution containing nickel, said nickel layer being formed on said first semiconductor region to create a Schottky barrier;

(c) placing a conductive metal layer overlying said barrier electrode; and, (d) forming an ohmic contact on said second semiconductor region.

2. A process as in claim 1, wherein said nickel layer is deposited from a solution containing nickel and hydrazine salts.

3. A process as in claim 1, wherein said nickel layer is deposited from a solution having a pH greater than 8 and wherein the deposition is carried out at a temperature of from about 75° C. to about 95° C.

4. A process as in claim 1, wherein said ohmic contact includes nickel which is chemically deposited onto said second semiconductor region at the same time as the deposition of said barrier electrode.

5. A process as in claim 1, wherein said conductive metal layer includes aluminum and has a thickness greater than about 1 μm.

6. A process as in claim 1, wherein the device is annealed after said deposition of said nickel layer at temperatures of from about 200° C. to about 450° C.

7. A process as in claim 1, wherein the device is side profiled using chemical etching at a depth of from about 0.05 μm to about 3 μm and a width of from about 10 μm to about 1 mm.

8. A process as in claim 7, wherein said etching is carried out using an etchant containing sulfuric acid.

9. A process as in claim 7 wherein said sides are heat treated.

10. A process as in claim 9, wherein said heat treatment is carried out in a gas containing hydrogen at a temperature of from about 250° C. to about 400° C. and for a time greater than about 10 minutes.

11. A process as in claim 7 wherein said profiled sides are protected by deposition of an organic dielectric.

12. A process as in claim 11, wherein said conductive metal layer overlies said barrier electrode and a portion of said dielectric layer, and wherein said first semiconductor region has a thickness, said portion having a width greater than said thickness.

13. A process for making a power Schottky semiconductor device, the device having a high reverse breakdown voltage and allowing high forward currents, the process comprising the step of:

(a) providing a semiconductor region including gallium arsenide;

(b) chemically depositing on said semiconductor region a barrier electrode in the form of an ordered epitaxial nickel layer so as to create a Schottky barrier having near-ideal Schottky barrier parameters over an extended area;

(c) placing a conductive metal layer overlying said barrier electrode; and (d) side profiling the device using chemical etching at a depth of from about 0.05 micrometers to about 3 micrometers and a width of from about 10 micrometers to about 1 mm.

14. A process as in claim 13, wherein said chemical etching is performed using a solution containing sulfuric acid.

15. A process as in claim 13, wherein said profiled sides are heat treated.

16. A process as in claim 15, wherein said heat treatment is carried out in a gas containing hydrogen at a temperature of from about 250° C. to about 400° C. and for a time greater than about 10 minutes.

17. A process as in claim 13, wherein said profiled sides are protected by deposition of an organic dielectric.

18. A process for making a power Schottky semiconductor device, the device having a high reverse breakdown voltage and allowing high forward currents, the process comprising the step of:

(a) providing a semiconductor region including gallium arsenide;

(b) chemically depositing on said semiconductor region a barrier electrode in the form of an ordered epitaxial nickel layer so as to create a Schottky barrier having near-ideal Schottky barrier parameters over an extended area;

(c) side profiling the device using chemical etching at a depth of from about 0.05 micrometers to about 3 micrometers and a width of from about 10 micrometers to about 1 mm;

(d) protecting said profiled sides by deposition of an organic dielectric; and (e) placing a conductive metal layer overlying said barrier electrode, said conductive metal layer extending to overlie a portion of said dielectric layer, wherein said semiconductor region has a thickness, said portion having a width greater than said thickness.

19. A process for chemical deposition from a basic solution containing nickel, of an ordered epitaxial nickel layer on a semiconductor region, comprising (a) preparing the surface of the semiconductor region on which the ordered epitaxial layer is to be chemically deposited from the basic solution containing nickel;

(b) cleaning said surface of the semiconductor region;

(c) subjecting said surface of the semiconductor region to brief chemical etching to remove any residual irregularities and impurities from said surface of the semiconductor region;

(d) exposing the semiconductor region for about one minute to a concentrated aqueous $NH_4OH$ solution to enrich said surface with $OH^-$ and $NH_4^+$ radicals;

wherein said cleaning is effected by successive washings; and, wherein said successive washings are effected using a boiling organic solvent, selected from the group consisting of carbon tetrachloride acetone, isopropyl alcohol, and methanol.

* * * * *